US005613140A

United States Patent [19]
Taira

[11] Patent Number: 5,613,140
[45] Date of Patent: Mar. 18, 1997

[54] QUANTUM DOT-TUNNEL DEVICE WHICH CAN BE SELECTIVELY EXCITED BY A FIRST LIGHT EMITTING SOURCE AND THE INFORMATION THUS STORED CAN BE READ WITH A SECOND LIGHT EMITTING SOURCE

[75] Inventor: Kenichi Taira, Tokyo, Japan

[73] Assignee: Sony Corporation, Tokyo, Japan

[21] Appl. No.: 320,375

[22] Filed: Oct. 11, 1994

Related U.S. Application Data

[63] Continuation of Ser. No. 902,668, Jun. 22, 1992, abandoned.

[30]    Foreign Application Priority Data

Jun. 21, 1991  [JP]  Japan .................................. 3-150446

[51] Int. Cl.⁶ .................................................. H01L 33/00
[52] U.S. Cl. ........................ 395/800; 257/14; 364/232.41; 364/244; 364/DIG. 1
[58] Field of Search ............................. 395/800, DIG. 1; 382/43; 257/22, 13, 14, 21, 30, 37; 359/17, 47, 55; 437/21, 23, 52; 361/DIG. 1, DIG. 2

[56]             References Cited

U.S. PATENT DOCUMENTS

| | | | |
|---|---|---|---|
| 4,099,207 | 7/1978 | Kornreich ................................. | 382/43 |
| 4,365,260 | 12/1982 | Holonyak, Jr. ............................ | 257/13 |
| 5,001,522 | 3/1991 | Takahashi et al. ........................ | 257/14 |
| 5,047,822 | 9/1991 | Little, Jr. et al. ........................ | 359/321 |
| 5,070,375 | 12/1991 | Sakai ........................................ | 257/15 |
| 5,079,601 | 1/1992 | Esaki et al. ............................... | 357/22 |
| 5,091,980 | 2/1992 | Ogawa et al. ............................. | 385/3 |
| 5,187,715 | 2/1993 | Weisbuch et al. ........................ | 372/46 |
| 5,371,379 | 12/1994 | Narusawa .................................. | 257/14 |

*Primary Examiner*—Alpesh M. Shah
*Attorney, Agent, or Firm*—Hill, Steadman & Simpson

[57]              ABSTRACT

A novel quantum dot-tunnel device having a revolutionarily faster processing speed and higher processing precision than conventional computer computation, which device has an array consisting of a large number of quantum dots which confine electrons three-dimensionally, with the coupling among quantum dots, that is, the tunnel transition probability, being defined by controlling the positional relationship and the shape of the quantum dots in accordance with an algorithm of predetermined information processing, so that the algorithm is expressed in solid state rather than by a conventional computer program. The electron transition among quantum dots occurs instantaneously and wave mechanically with a strict precision, and the results of the information processing are expressed as a spatial distribution of electrons over the plurality of quantum dots. Data is written into the quantum dots by irradiating light (high energy) of a wavelength corresponding to the band gap energy, for example, to a specific region on the array, while data is read out by irradiating light (low energy) of a wavelength corresponding to the energy gap between a ground level of the valence band and a first excited level. Also, an information processing apparatus and method using the device.

2 Claims, 4 Drawing Sheets

QUANTUM DOT-TUNNEL DEVICE WHICH CAN BE SELECTIVELY EXCITED BY A FIRST LIGHT EMITTING SOURCE AND THE INFORMATION THUS STORED CAN BE READ WITH A SECOND LIGHT EMITTING SOURCE

This is a continuation, of application Ser. No. 07/902,668, filed Jun. 22, 1992, now abandoned.

BACKGROUND OF THE INVENTION

1. Field of the Invention

The present invention relates to a quantum dot-tunnel device which forms quantum dots for confining electrons three-dimensionally and to an information processing apparatus and method using the same.

2. Description of the Related Art

Metallization technology is essential for connecting devices in current-day VLSI technology. Along with the increasingly higher degrees of integration of devices, the percentage of the area occupied by metal interconnection portions on the wafer has increased. If the rate of occupancy of the metal interconnections grows higher in this way, these metal interconnections will conversely end up limiting the speed of information processing.

Therefore, integrated circuits which are connected by light, rather than connected by electricity using metal films and electroconductive films, are being considered. For example, the IEEE Journal of Solid State Circuits, Vol. 25, No. 1, p. 11 to 18 (1990), "Design of 4-kbit×4-Layer Optically Coupled Three-Dimensional Common Memory for Parallel Processor System" reports a memory device which transfers signals between three-dimensional integrated circuits by optical energy.

However, even with an optical energy integrated circuit (OEIC) etc., the basic circuit construction is an extension of the conventional circuit construction and high speed operation is displayed by only a part of the hardware. For example, if OEIC's are used to try to solve basic problems of the theory of functions or fluid dynamics by numeral calculation, there are cases where the amount of calculation will be large and the solution will not be converged upon even using an algorithm by the differential calculus method or Monte Carlo method and there are limits to the calculation ability.

SUMMARY OF THE INVENTION

Therefore, the present invention, in view of the above-mentioned technical problem, has as its object the provision of a novel mesoscopic electronic device with revolutionary processing speed and accuracy compared with conventional information processing capabilities and of an information processing apparatus and a method using the same.

To achieve the above-mentioned object, the device of the present invention is a quantum dot-tunnel device making use of the quantum effect, characterized in that a plurality of quantum dots confining electrons three-dimensionally are formed in a positional relationship or shape enabling the probability of tunnel transition among the quantum dots to be fit to an algorithm of predetermined information processing and in that the results of the information processing are expressed by the spatial distribution of the electrons across the plurality of quantum dots.

Quantum dots are regions of a size where the effect of quantum confining of electrons can be obtained and, for example, are regions delineated by the quantum dynamic electron wavelength degree.

The "predetermined information processing" means various types of information processing such as numerical calculations, control, problem solving, pattern recognition, language comprehension, inference processing, etc., more specifically advanced numerical calculation enabling solutions to be found for differentiate equations, for example, weather forecasts, diffusion equations, etc.

The coupling state among quantum dots, that is, the probability of electrons moving due to the tunnel effect, in general is dependent on the distance between quantum dots and the shape of the quantum dots. Therefore, if the distance between quantum dots and the shape of the quantum dots are determined in accordance with the content of the information processing, it becomes possible to express in a solid state the algorithm of the information processing.

By this, processing of an epochal high speed and high precision never before seen in the past becomes possible. That is, since the coupling between quantum dots is made equivalently with the algorithm along the flow of the predetermined information processing, the tunnel transition of the electrons between quantum dots corresponds to execution of a program of a computer. The spatial distribution of the electrons in the group of quantum dots is achieved by the parallel tunnel transition among a plurality of quantum dots. Further, since the tunnel transition among quantum dots occurs instantaneously, a much higher computation speed than the conventional computer speeds is obtained. Needless to say, since no metal interconnections are used in the device of the present invention, naturally no problem of delayed operation etc. occurs. Further, the tunnel transition is achieved wave mechanically with a strict precision, so extremely high speed information processing becomes possible.

Further, the information processing apparatus using the quantum dot-tunnel device of the present invention has a quantum dot-tunnel device according to the present invention, a data input means which inputs data by irradiation of light on the quantum dot-tunnel device, and a data output means which outputs data by detecting the spatial distribution of electrons of the quantum dot-tunnel devices.

Still further, the information processing method using the information processing apparatus is characterized in that light is irradiated on the quantum dots of the device and, after tunnel transition of the electrons, the spatial distribution of the electrons of the quantum dots is detected and the data is output.

The data input (write) means uses irradiation of light to locally irradiate some of the regions of the device and excite the quantumized level of the conduction band in the quantum dots. Therefore, as the data input light, light of a wavelength having energy of a band gap degree may be selected and used. This corresponds to the general computer data input. At this time, it is sufficient if the holes occurring simultaneously in the valence band be extinguished upon application of an electric field.

The data output means is for detecting the spatial distribution of electrons. As one example, in the case of use of irradiation of light, light of a wavelength of an extent corresponding to the energy difference between the ground level of the conduction band and the first excited level is irradiated to the device and the distribution of electrons is detected based on the light absorption.

In this way, if use is made of light of a wavelength differing at the data input means and the data output means, it is possible to distinguish between the input and output.

DESCRIPTION OF THE PREFERRED EMBODIMENTS

Below, a preferred embodiment of the present invention will be explained with reference to the drawings.

Figure 1:
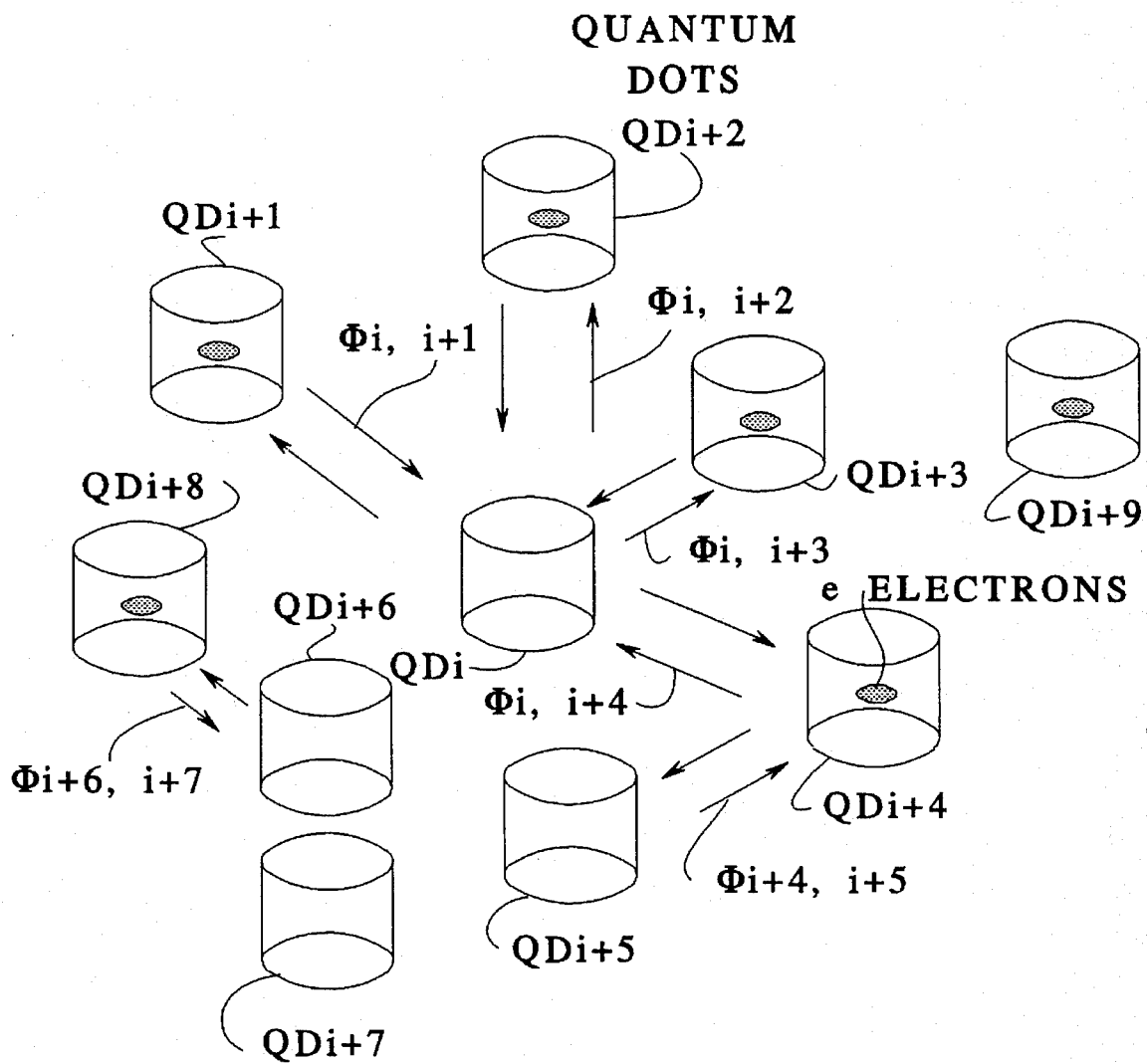
FIG. 1 is a schematic view for explaining the coupling among a plurality of quantum dots in an example of the constitution of a quantum dot-tunnel device of the present invention.

First, an explanation will be made of the quantum dots of the quantum dot-tunnel device of the present embodiment with reference to FIG. 1. The quantum dots $QD_i$, $QD_{i+1}$, ..., $QD_{i+9}$ are formed in sizes for confining the electrons e, that is, sizes of about the quantum dynamic wavelength (de Broglie wavelength) of the electrons, and have cylindrical shapes. Here, the quantum dots $QD_i$, $QD_{i+1}$, ..., $QD_{i+9}$ are cylindrically shaped, but they may be other shapes as well, for example, squares, blocks, cones, pyramids, etc. Further, the quantum dots $QD_i$, $QD_{i+1}$, ..., $QD_{i+9}$ here are the same in size, but the quantum dots may also have different sizes and shapes. These quantum dots $QD_i$, $QD_{i+1}$, ..., $QD_{i+9}$ are formed, for example, by semiconductors, in particular compound semiconductors. The materials comprising the quantum dots may be selected in accordance with the wavelength of the light used for the input and output of data.

These quantum dots $QD_i$, $QD_{i+1}$, ..., $QD_{i+9}$ are disposed close to one or more other quantum dots. The distance at which the quantum dots $QD_i$, $QD_{i+1}$, ..., $QD_{i+9}$ are closely disposed is made the distance of wave function overlap, that is, the distance at which there is a probability of tunnel transition. One quantum dot $QD_x$ is only disposed close to one other quantum dot $QD_{x+1}$, while another quantum dot $QD_z$ is disposed close to a plurality of quantum dots $QD_{z+1}$, $QD_{z+2}$ ..., with the array being formed overall in this way. In this embodiment, the distance between quantum dots is the distance in the plane, but may be a three-dimensional distance as well. In FIG. 1, the probability of transition between two quantum dots is shown by F, with for example the probability of transition between the quantum dots $QD_i$ and $QD_{i+1}$ being $F_{i,i+1}$. The probability of transition F is dependent on the square of the wave function. When considering transition of an electron from one quantum dot to another quantum dot, the flow of electrons may be expressed by the product of the number of electrons and the probability of transition F.

This array of the quantum dots $QD_i$, $QD_{i+1}$, ..., $QD_{i+9}$ constitutes one system for information processing. In this device, the probability of transition F between quantum dots is made to locally follow a differentiate equation based on an algorithm of information processing. The nonlinear component of the coupling between quantum dots may be realized by Coulomb interaction. As a result, the electrons engage in tunnel transition between the quantum dots in accordance with the probability of transition F and the spatial distribution of electrons changes in accordance with the differentiate equation of the information processing. For example, when the quantum dot-tunnel device is a device for solving a certain diffusion equation, that is, is a kind of simulation engine, the couplings among quantum dots are considered to follow the diffusion equation. Electrons are supplied or excited for the single or number of quantum dots as initial values of the diffusion phenomenon. The spatial distribution of the electrons is detected after the tunnel transition of the electrons, whereby the diffusion phenomenon is simulated in accordance with the diffusion equation. In the quantum dot-tunnel device of the present embodiment, a sequential circuit is constituted wherein the $QD_i$, $QD_{i+1}$, ..., $QD_{i+9}$ are arranged in mutual relationship with each other. Parallel processing for handling a plurality of types of data simultaneously is also possible.

In such a quantum dot-tunnel device using quantum dots $QD_i$, $QD_{i+1}$ ..., the tunnel transition among quantum dots can be precisely calculated by a wave function and extremely accurate data can be obtained. It is possible to reduce the error in information processing and achieve higher precision. The transition of electrons occurs without going through metal interconnections etc., so the information processing speed is not limited by the resistance of the metal interconnections. Further, since parallel processing is possible, the information processing speed becomes much faster and there is a possibility for operation at room temperature as well.

Further, when comparing with a computer, since the software functions are performed by the couplings of the quantum dots themselves, epochmaking information processing as never before seen is realized.

Next, an explanation will be made of the input of data (writing) to the quantum dot-tunnel device of the present embodiment with reference to FIGS. 2 and 3.

Figure 2:
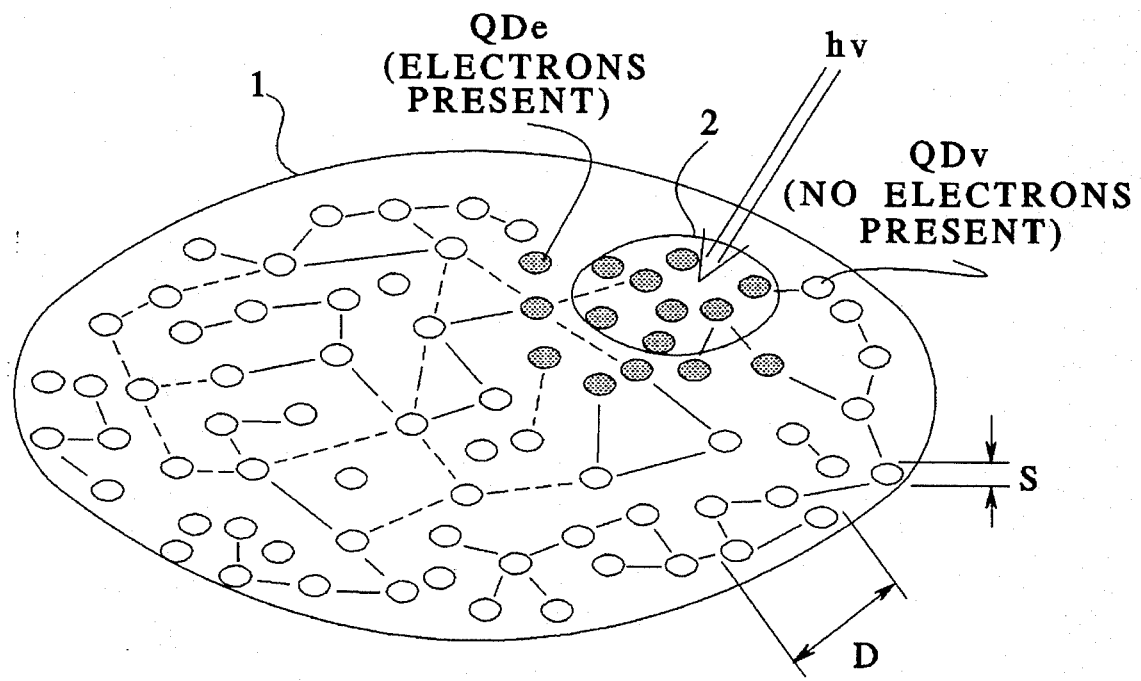
FIG. 2 is a schematic view showing the state of data input (writing) to an example of a quantum dot-tunnel device of the present invention.
Figure 3:
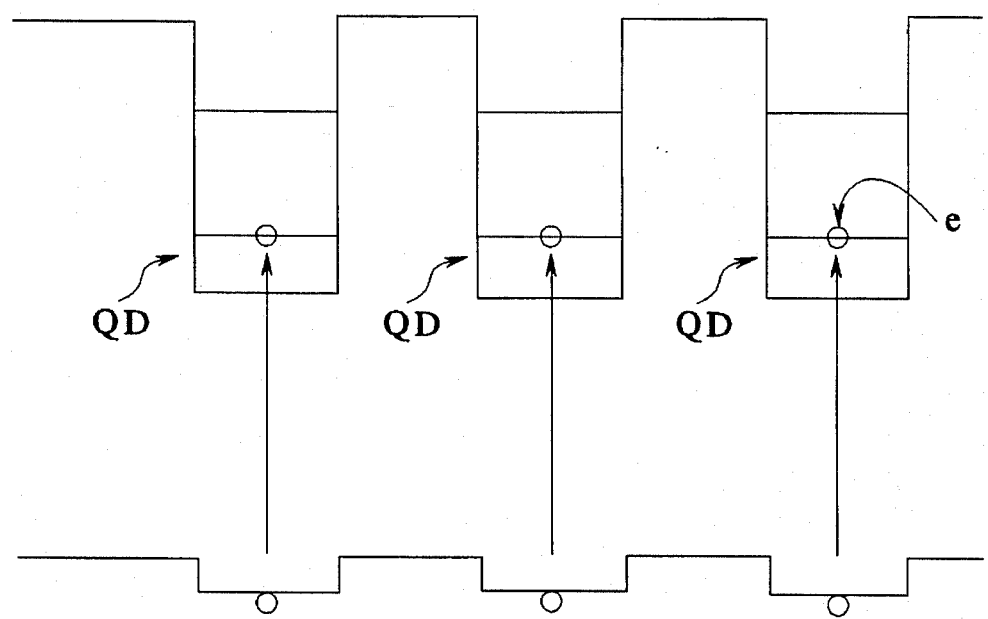
FIG. 3 is an energy potential chart for explaining the mechanism of the above-mentioned data input (writing) by transition of electrons.

FIG. 2 shows the quantum dot array 1 of a quantum dot-tunnel device of the present embodiment, wherein in the figure, the black dots (•) show quantum dots $QD_e$ where electrons are present, while the white circles (o) show quantum dots $QD_v$ where no electrons exist. The size S of the quantum dots is made about the quantum dynamic wavelength of the electrons and the distance D between quantum dots is the distance corresponding to the transition probability. The size S and the distance D both have values of about 1 to 10 nm. During data input, this array 1 is locally irradiated with light (hv) as shown by the thick arrow in the figure. The light is made one with a wavelength of about 1 mm and is produced by a laser etc.

When light is irradiated for data input, the electrons are excited in the quantum dots included in the irradiated region 2. FIG. 2 shows schematically the state at the time of writing. In the three quantum dots QD, the electrons e are excited to the quantumized ground level of the conduction band from the valence band. The energy gap in the quantum dots is about 1 eV or so. If the wavelength is about 1 mm, excitation becomes possible.

The device in which data is input by irradiation of light in this way displays a spread of the electron distribution along with time. This distribution is also dependent on the past hysteresis of the data input. Here, if the electron distribution in the device is tracked over time, it is possible to obtain a transient solution to the differentiate equation.

Next, an explanation will be made of the output of data (reading) from the quantum dot-tunnel device of the present embodiment with reference to FIGS. 4 and 5.

Figure 4:
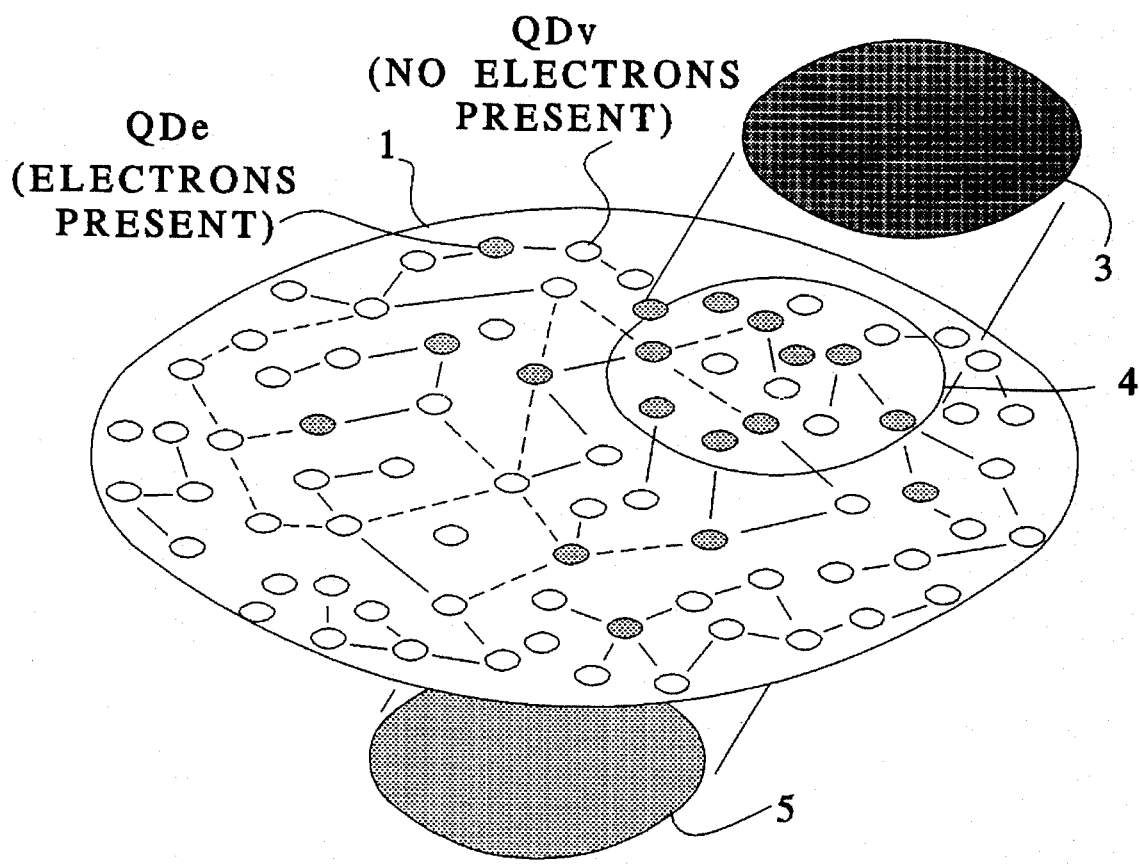
FIG. 4 is a schematic view showing the state of data output (reading) from an example of the quantum dot-tunnel device of the present invention.
Figure 5:
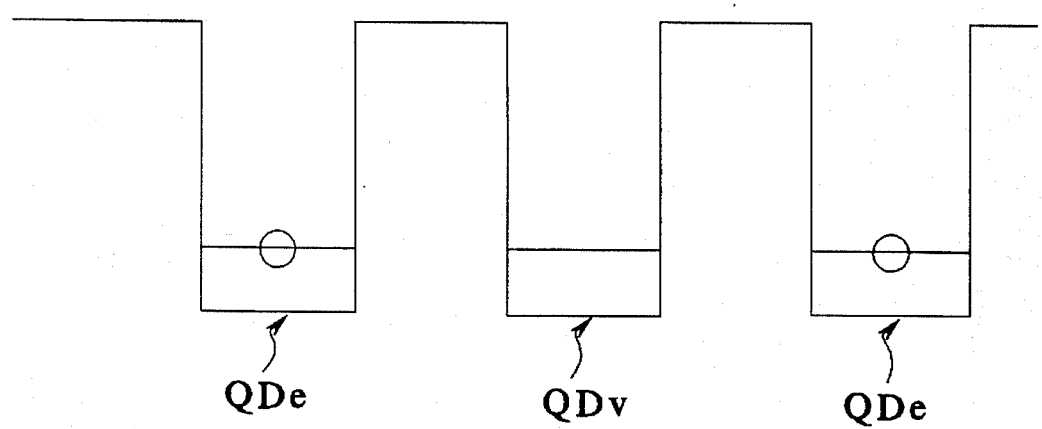
FIG. 5 is an energy potential chart for explaining the mechanism of the above-mentioned data output (reading) by transition of electrons in accordance with the absorption of light.

FIG. 4 is a view showing the quantum dot array 1 of a quantum dot-tunnel device of the present embodiment the same as in FIG. 2. In FIG. 4, the block dots (•) indicate the quantum dots QDe where electrons are present, while the white circles (o) indicate schematically the quantum dots QDv where no electrons are present. FIG. 4 shows the state of the spatial distribution of the electrons in the device in accordance with the results of the information processing. The data output, that is, the reading of data, is performed by irradiation of light. In FIG. 4, the spot 3 shows the beam from the light source. The region 4 irradiated by the beam is the region which is covered by the reading operation. This beam passes through the quantum dot array 1. The spot 5 obtained after it passes through comes to include the information on the local distribution of electrons. By receiving the spot 5 on an optical detection device, the results of the information processing, that is, the output data, is obtained. Here, as the data readout light, use is made of light of a wavelength of several mm or so so as not to cause unnecessary data input. That is, to prevent unnecessary excitation from the valence band to the ground level of the conduction band, use is made of light of a longer wavelength, that is, a lower energy, than the data writing light.

This reading of data by the locally passing light will be explained by the following principle. Reading light excites the electrons in the quantum dots from the ground level to the first excited level. The energy of the light needed for this excitation is several hundred meV. This is far smaller than the energy of light required for excitation from the valence band to the conduction band. Therefore, the energy of the reading light is absorbed only inside the quantum dots QDe where electrons are already present. That is, as shown in FIG. 5, in the quantum dots QDe where electrons are already present, when the reading light passes through the quantum dot array 1, the light is absorbed and the electrons are excited to the first excited level, but in the quantum dots QDv where electrons do not exist, the electrons are not excited even if light is irradiated, so no light is absorbed. Due to this, if the spatial distribution of electrons in the region 4 irradiated by light is dense, the intensity of the passing light becomes weaker, while if the spatial distribution of the electrons is sparse, the intensity of the passing light becomes stronger. Therefore, by measuring the beam of the passing light, the spatial distribution of the electrons is found and it is possible to determine the results of the information processing from this distribution.

Figure 6:
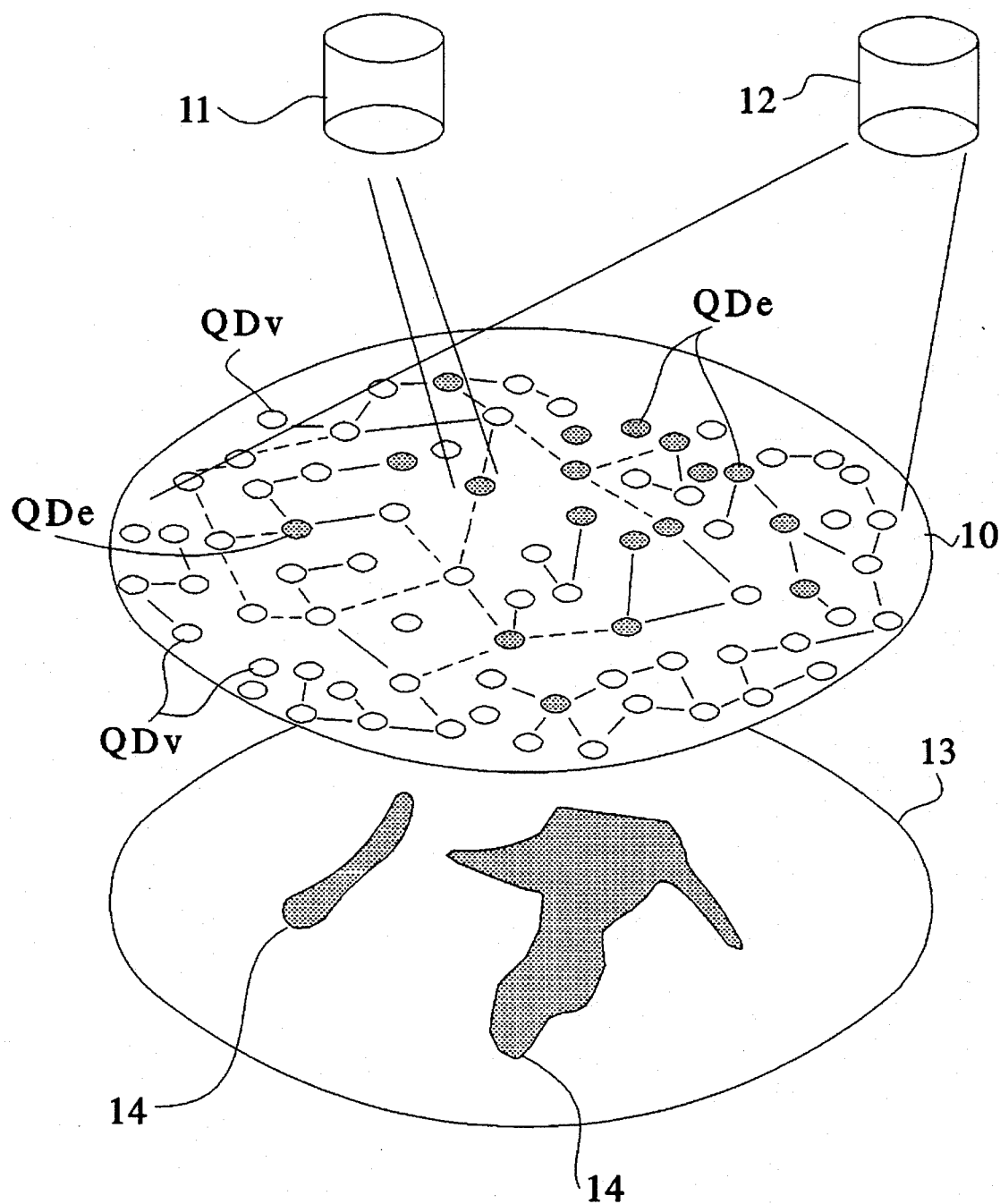
FIG. 6 is a schematic view showing an example of the information processing apparatus using the quantum dot-tunnel device of the present invention.

FIG. 6 shows an example of the information processing apparatus using a quantum dot-tunnel device. In this apparatus, use is made of a planer quantum dot array and the quantum dot-tunnel device 10 is made a flat plate in shape. In the quantum dot-tunnel device 10 a plurality of quantum dots are disposed in accordance with an algorithm of the information to be processed. On one main side of the quantum dot-tunnel device 10, a laser light source 11 for writing and a laser light source 12 for reading are disposed.

The writing laser light source 11 is given a wavelength of about 1 mm. When light energy is absorbed in the quantum dots, electrons are generated in the quantum dots. In the figure, the quantum dots QDe where electrons are present are shown by the block dots (•), while the quantum dots QDv where no electrons are present are shown by the white circles (o). The writing laser light source 11 irradiates laser light locally on the quantum dot-tunnel device. The writing laser light source 11 may be provided with a scanning mechanism, not shown, so as to enable irradiation of light to any region. Conversely, the quantum dot-tunnel device 10 may be made one which can rotate or be moved.

The reading laser light source 12 is given a wavelength of about several mm. The light energy is selectively absorbed in the quantum dots QDe where electrons are present. In the quantum dots QDv where no electrons are present, the laser light is not absorbed. The reading laser light source 12 may be one which irradiates a wide range of the quantum dot-tunnel device 10. At the rear side of the quantum dot-tunnel device 10, that is, the side opposite to the side where the laser light sources 11 and 12 are provided, a two-dimensional light detector 13 is disposed. The two-dimensional light detector 13 is used at the time of reading. In the region corresponding to the spatial distribution of the quantum dots QDe where electrons are present, the light intensity becomes weaker. The distribution of the light intensity detected by the two-dimensional light detector 13 expresses the results of computation of the quantum dot-tunnel device.

Using this information processing apparatus, it is possible to perform high speed information processing and to obtain highly precise data output. The quantum dot-tunnel device 10 is made a unique one in accordance with the type of the information processing, so by changing with quantum dot-tunnel devices having other quantum dot arrays, other information processing becomes possible. Further, it is possible to handle more complicated computing processing by constructing the quantum dot-tunnel device in three dimensions.

What is claimed is:

1. A quantum dot-tunnel device comprising a plurality of side-by-side quantum dots mounted on a transparent base, first light emitting means for selectively scanning during a first time period said plurality of quantum dots so as to selectively excite electrons in certain ones of said quantum dots to an energy level which is higher than they were before such excitation, a second light emitting means for scanning during a second time period said plurality of quantum dots, and said second light emitting means mounted on one side of said transparent base, and a two-dimensional light detecting means mounted on the opposite side of said transparent base from which said second light emitting means is mounted so as to detect during said second time period which ones of said quantum dots have electrons which have been excited by detecting the light energy which has passed straight through said transparent base; wherein the energy level of said first light emitting means is substantially higher than the energy level of said second light emitting means; wherein the energy level of said first light emitting means is such to excite electrons in said quantum-dots from the quantimized ground level of the conduction band from the valence band, and the wavelength of the light from said first light emitting means is about 1 mm, wherein the energy level of said second light emitting means is such to excite electrons between a ground level of a valence band of the quantum dots and a first excited level and the wavelength of the light from the second light emitting means is about several mm, and wherein the output of said first laser light emitting source has a wavelength having an energy equivalent to a band gap of the said quantum dots.

2. A quantum dot-tunnel device as set forth in claim 1, characterized in that the said quantum dots are comprised of a compound semiconductor.

* * * * *